(12) United States Patent
Carlough et al.

(10) Patent No.: US 7,660,838 B2
(45) Date of Patent: Feb. 9, 2010

(54) SYSTEM AND METHOD FOR PERFORMING DECIMAL TO BINARY CONVERSION

(75) Inventors: Steven R. Carlough, Poughkeepsie, NY (US); Bruce M. Fleischer, Bedford Hills, NY (US); Wen H. Li, Poughkeepsie, NY (US); Eric M. Schwarz, Gardiner, NY (US)

(73) Assignee: International Business Machines Corporation, Armonk, NY (US)

( * ) Notice: Subject to any disclaimer, the term of this patent is extended or adjusted under 35 U.S.C. 154(b) by 650 days.

(21) Appl. No.: 11/054,233

(22) Filed: Feb. 9, 2005

(65) Prior Publication Data

US 2006/0179091 A1    Aug. 10, 2006

(51) Int. Cl.
*G06F 15/00* (2006.01)
(52) U.S. Cl. ..................................... 708/204
(58) Field of Classification Search .......... 708/200–211
See application file for complete search history.

(56) References Cited

U.S. PATENT DOCUMENTS

| | | | |
|---|---|---|---|
| 3,276,013 A * | 9/1966 | Chandler | ..................... 341/85 |
| 3,649,822 A | 3/1972 | Mersten | |
| 3,711,693 A | 1/1973 | Dahl | |
| 3,845,290 A | 10/1974 | Reitsma | |
| 3,862,407 A | 1/1975 | Baldauf et al. | |
| 4,325,056 A | 4/1982 | Wiener | |
| 4,331,951 A | 5/1982 | Flora et al. | |
| 4,342,026 A | 7/1982 | Hanson | |
| 4,430,643 A | 2/1984 | Sevilla | |
| 4,719,450 A | 1/1988 | Yamauchi | |
| 4,792,793 A | 12/1988 | Rawlinson et al. | |
| 5,146,422 A | 9/1992 | Maass et al. | |
| 5,251,321 A | 10/1993 | Boothroyd et al. | |
| 5,258,945 A * | 11/1993 | Lee et al. | ..................... 708/624 |
| 5,982,307 A * | 11/1999 | Adachi | ........................ 341/84 |
| 6,525,679 B1 * | 2/2003 | Cowlishaw | ................. 341/104 |
| 7,136,893 B2 * | 11/2006 | Carlough et al. | ............ 708/623 |

* cited by examiner

*Primary Examiner*—Chat C Do
(74) *Attorney, Agent, or Firm*—Cantor Colburn LLP; John Campbell

(57) ABSTRACT

A method for converting from decimal to binary including receiving a binary coded decimal (BCD) number made up of one or more sets of three digits. A running sum and a running carry are set to zero. A process is performed for each set of three digits in the BCD number in order from the set of three digits containing the three most significant digits of the BCD number to the digits containing the three least significant digits of the BCD number. The process includes: creating six partial products based on the set of three digits, the running sum and the running carry; combining the six partial products into two partial products; and storing the two partial products in the running sum and the running carry. The running sum and the running carry from each set of three digits are combined into a final binary result.

7 Claims, 3 Drawing Sheets

| Col wt | 8192 | 4096 | 2048 | 1024 | 512 | 256 | 128 | 64 | 32 | 16 | 8 | 4 | 2 | 1 |
|---|---|---|---|---|---|---|---|---|---|---|---|---|---|---|
| 2 power | 13 | 12 | 11 | 10 | 9 | 8 | 7 | 6 | 5 | 4 | 3 | 2 | 1 | 0 |
| 1 | S | S | S | S | | | | | | | | | | |
| 2 | S' | S' | S' | S' | S' | S' | S' | S' | S' | | | | | |
| 3 | S | S | S | S | S | S | S | S | S | S | S | | | |
| 4 | C | 0 | 0 | 0 | | | | | | | | | | |
| 5 | C' | C' | C' | C' | C' | C' | 1 | 1 | 1 | | | | | |
| 6 | C | C | C | C | C | C | C | C | 0 | 0 | 0 | | | |
| 7 | | | | | X0 | X1 | X2 | X3 | | | | | | |
| 8 | | | | | | X0 | X1 | X2 | X3 | | | | | |
| 9 | | | | | | | | | X0 | X1 | X2 | X3 | | |
| 10 | | | | | | | | Y0 | Y1 | Y2 | Y3 | | | |
| 11 | | | | | | | | | | Y0 | Y1 | Y2 | Y3 | |
| 12 | | | | | | | | | | Z0 | Z1 | Z2 | Z3 | |
| (5 extra) | | | | | | | | | 1 | | | | | |
| (2 extra) | | | | | | | | | 1 | | | | | |

FIG. 1

| Column Weight | 8192 | 4096 | 2048 | 1024 | 512 | 256 | 128 | 64 | 32 | 16 | 8 | 4 | 2 | 1 |
|---|---|---|---|---|---|---|---|---|---|---|---|---|---|---|
| Power of 2 | 13 | 12 | 11 | 10 | 9 | 8 | 7 | 6 | 5 | 4 | 3 | 2 | 1 | 0 |
| 1 | S | S | S | S | X0 | X1 | X2 | X3 | X0 | X1 | X2 | X3 | — | — |
| 2 | C | — | — | — | X0 | X0' | X1 | X2 | X3 | Y0 | Y1 | Y2 | Y3 | — |
| 3 | S' | S' | S' | S' | S' | S' | S' | S' | S' | — | Z0 | Z1 | Z2 | Z3 |
| 4 | C' | C' | C' | C' | C' | C' | — | Y0 | Y1 | Y2 | Y3 | — | — | — |
| 5 | S | S | S | S | S | S | S | S | S | S | S | — | — | — |
| 6 | C | C | C | C | C | C | C | C | 1 | — | — | — | — | — |

NOTE THAT THE 3:2 COUNTERS ARE ORDERED IN SUCH A WAY THAT THE CARRY (C) LEAST SIGNIFICANT 3 BITS ARE ZERO.

FIG. 2

SYSTEM AND METHOD FOR PERFORMING DECIMAL TO BINARY CONVERSION

TRADEMARKS

IBM® is a registered trademark of International Business Machines Corporation, Armonk, N.Y., U.S.A. S/390, Z900 and z990 and other names used herein may be registered trademarks, trademarks or product names of International Business Machines Corporation or other companies.

BACKGROUND OF THE INVENTION

This invention relates generally to data conversion, and more particularly, to converting a number from decimal to binary.

Decimal calculations are becoming more prevalent in today's computers. For example, all financial calculations are inherently decimal calculations. However, most computers operate more efficiently on binary data because the digital circuits are optimized for two-value logic. This causes a need to convert decimal formats to binary formats and vice versa. Currently, look-up tables are utilized to perform conversions from decimal formats to binary formats. Typically, when using a look-up table, the components of the ones digit is added to the tens digit and to the hundreds digit. The use of a look-up table can have negative impact on the speed of the conversion. It would be desirable to be able to perform the conversion from decimal to binary as efficiently as possible in order to provide a high performance computer system.

BRIEF SUMMARY OF THE INVENTION

Exemplary embodiments of the present invention include a method for converting from binary to decimal. The method includes receiving a binary coded decimal (BCD) number made up of one or more sets of three digits. A running sum and a running carry are set to zero. The following steps are performed for each set of three digits in the BCD number in order from the set of three digits containing the three most significant digits of the BCD number to the set of three digits containing the three least significant digits of the BCD number. Note that the BCD number to be converted need not have a multiple of three number of significant digits, it can be extended with zeros on the most significant side until it does have a multiple of three number of significant digits without changing the value. The steps include: creating six partial products based on the set of three digits, the running sum and the running carry; combining the six partial products into two partial products; and storing the two partial products in the running sum and the running carry. After the loop has been performed for each set of three digits in the BCD number, the running sum and the running carry are combined into a final binary result.

Additional exemplary embodiments include a system for converting from binary to decimal. The system includes an input latch for storing a BCD number made up of one or more sets of three digits. The system also includes a running sum latch for storing a running sum and a running carry latch for storing a running carry. Further, the system includes a mechanism for receiving the BCD number into the input latch, setting the running sum to zero, and setting the running carry to zero. The mechanism repeats the following steps for each set of three digits in the BCD number in order from the set of three digits containing the three most significant digits of the BCD number to the set of three digits containing the three least significant digits of the BCD number. The steps include: creating six partial products based on the set of three digits, the running sum and the running carry; combining the six partial products into two partial products; and storing the two partial products in the running sum and the running carry. After the loop has been performed for each set of three digits in the BCD number, the running sum and the running carry are combined into a final binary result by the mechanism.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 is an exemplary embodiment of a partial product array with twelve terms that may be utilized by exemplary embodiments of the present invention;

FIG. 2 is an exemplary partial product array with six terms that may be utilized by exemplary embodiments of the present invention.

Figure 3:
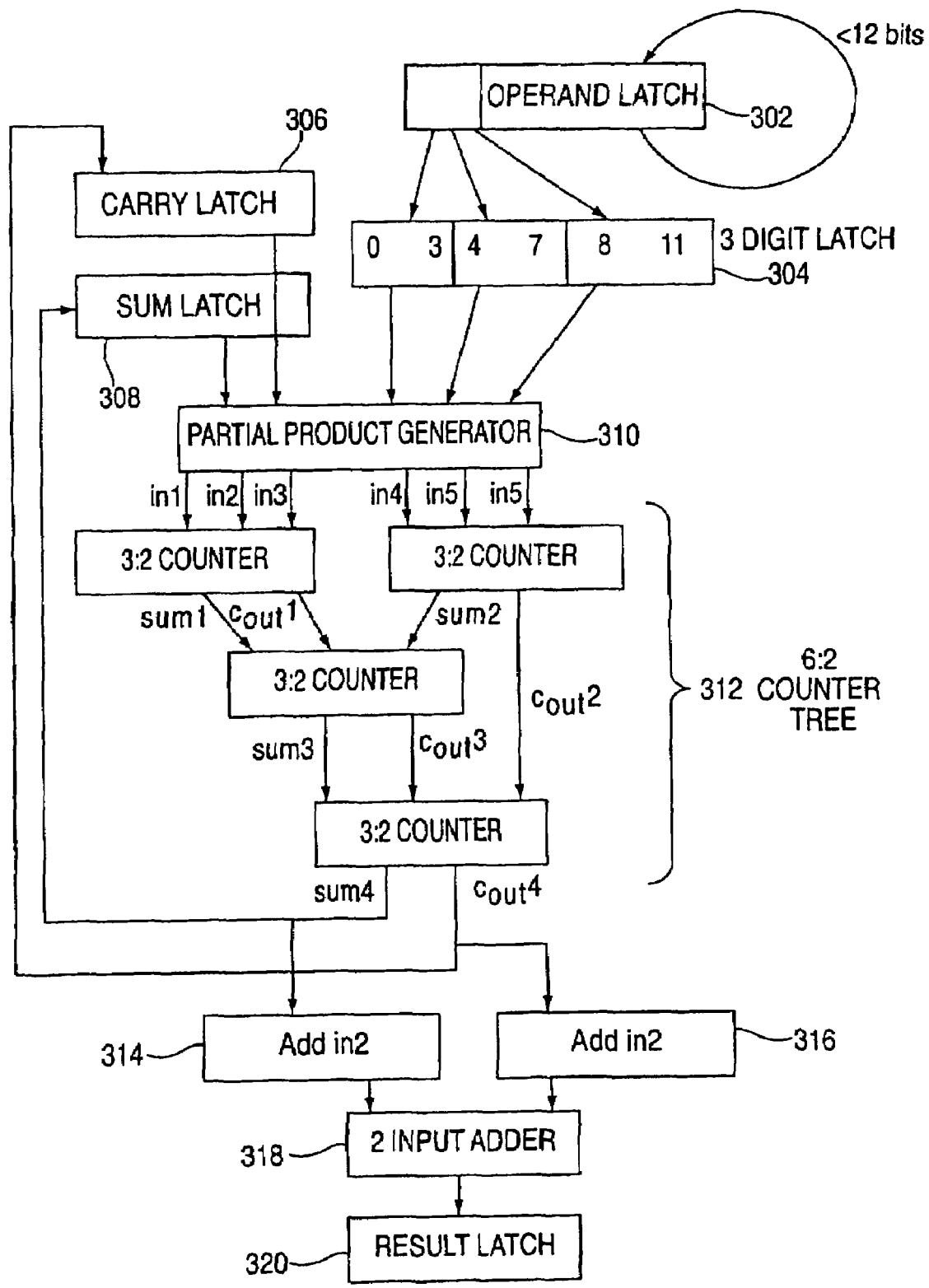
FIG. 3 is block diagram of a decimal to binary converter that may be implemented by exemplary embodiments of the present invention.

The detailed description explains the preferred embodiments of the invention, together with advantages and features, by way of example with reference to the drawings.

DETAILED DESCRIPTION OF THE PREFERRED EMBODIMENTS

Exemplary embodiments of the present invention include a 6:2 counter tree to reduce the conversion of three decimal binary coded decimals (BCDs) per cycle. The counter tree has six partial products which are quickly reduced to a redundant result containing a sum and a carry term. This redundant result is fed back to the counter tree and multiplied by the equivalent of one thousand. Then, three new digits are converted. This process continues until all of the digits are converted.

Decimal numbers are commonly represented in BCD form. Exemplary embodiments of the present invention include a high speed hardware implementation for conversion of multiple BCD digits to binary format using a counter tree. Counter trees are common in multipliers. In each cycle, three decimal BCD digits are converted to binary using a 6:2 counter tree which accumulates the converted sum into a redundant carry save format. Eventually, the carry save format is reduced to binary with a two input adder.

Following is an exemplary derivation of a six row partial product array that may be utilized by exemplary embodiments of the present invention to convert a decimal number to binary. D represents a decimal number in BCD format and $d_i$ is a digit in the decimal number.

$$D = \sum_{i=0}^{n} d_i \times 10^i$$

-continued $$D = \sum_{j=0}^{n/3} (d_{3j} + d_{3j+1} \times 10 + d_{3j+2} \times 100) * 1000^j$$

Computing the above formula iteratively results in the following formula, where X, Y and Z are the three decimal BCD digits of the decimal number, D.

$\text{sum}_i = \text{sum}_{i-1} \times 1000 + X \times 100 + Y \times 10 + Z \times 1$ Expressing the above iterative formula in terms of binary powers results in the following formula.

$\text{sum}_i = \text{sum}_{i-1} \times (1024 - 32 + 8) + X \times (64 + 32 + 4) + Y \times (8 + 2) + Z$ Then, using a redundant carry save notation for the sum results in the following.

$S_i + C_i = S_{i-1} \times (2^{10} - 2^5 + 2^3) + C_{i-1} \times (2^{10} - 2^5 + 2^3) + X \times (2^6 + 2^5 + 2^2) + Y \times (2^3 + 2^1) + Z$ Adding the shifted versions of $S_{i-1}, C_{i-1}, X, Y$ and Z results in a twelve row partial product array. FIG. 1 is an exemplary embodiment of a partial product array with twelve terms that results from adding shifted versions of $S_{i-1}, C_{i-1}, X, Y$ and Z. X0 is the most significant bit (MSB) of X and X3 is the least significant bit (LSB) of X. Similarly, Y0 is the MSB of Y, Y3 is the LSB of Y, Z0 is the MSB of Z, and Z3 is the LSB of Z. C and S are n-bit representations of $C_{i-1}$ and $S_{i-1}$ where the three LSBs of $C_{i-1}$ are assumed to be zero. FIG. 1 depicts only the fourteen LSBs of the partial product array. This array may be collapsed into a six row array as depicted in FIG. 2. FIG. 2 is an exemplary partial product array with six terms that may be utilized by exemplary embodiments of the present invention. Note that the three LSBs of the carry are indeed zero as assumed above due to the limited carry propagation that occurs in the counter tree.

FIG. 3 is a block diagram of a decimal to binary converter that may be implemented by exemplary embodiments of the present invention. The converter includes an operand latch 302 for holding the BCD number to be converted into binary. The contents of the operand latch 302 are shifted left twelve bits every cycle with the twelve MSBs (i.e., the three most significant digits) of the BCD number being transferred to the three digit latch 304 every cycle. The three digits being transferred to the three digit latch 304 every cycle are referred to herein as sets of three digits. The first digit in bit positions 0-3 of the three digit latch 304 corresponds to the "X" variable described above, the second digit in bit positions 4-7 corresponds to the "Y" variable described above, and the third digit in bit positions 8-11 corresponds to the "Z" variable described above.

The contents of the three digit latch 304 (i.e. X, Y and Z) are input into a partial product generator 310 along with a running sum that is stored in the running sum; latch 308 and a running carry that is stored in the carry latch 306. The running sum and the running carry are reset to zero at the start of the decimal to binary conversion process for each BCD number. The running sum corresponds to $S_{i-1}$, as described previously, and the running carry corresponds to $C_{i-1}$, as described previously. The values in the running sum and the running carry reflect the output from the last execution of the 6:2 counter tree 312 or, alternatively, a value of zero if this is the first time that the partial product generator 310 is being executed for the BCD number. The partial product generator 310 creates a six row partial product tree based on the three digits, as well as the running sum and the running carry. The six partial products in the partial product tree created by the partial product generator 310 are combined into two partial products by a 6:2 counter tree 312. In an exemplary embodiment of the present invention, the 6:2 counter tree 312 includes four 3:2 counters for reducing the six rows to two rows by adding them. The output from the 6:2 counter tree 312, the running sum and the running carry, are stored in the sum latch 308 and the carry latch 306, respectively, and are utilized as input to the partial product generator 310 along with the next set of three digits entered into the partial product generator 310.

Once all of the digits, or sets, in the BCD number have been sent through the 6:2 counter tree 312, the running sum and the running carry are combined to create a final binary result. The running sum is input to a latch 314 and the running carry is input to another latch 316 for input to a two input adder 318. The sum of the two inputs is calculated and a final binary result is output to a result latch 320.

Exemplary embodiments of the present invention provide a high-speed method of converting three decimal BCD digits to binary every cycle using a counter tree and feeding back a redundant sum. This method requires no look-up tables, this may lead to increased performance. In addition, exemplary embodiments of the present invention utilize a high speed counter tree, as well as a general purpose two input adder and very little extra circuitry.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A computer-implemented method for converting from decimal to binary using a hardware counter tree, the method comprising:

receiving a binary coded decimal (BCD) number made up of one or more sets of three digits into a hardware input latch;

setting a running sum in a hardware running sum latch and a running carry in a hardware running carry latch to zero;

repeating for each set of three digits in the BCD number in order from the set of three digits containing the three most significant digits of the BCD number to the set of three digits containing the three least significant digits of the BCD number:

creating six partial products based on the set of three digits, the running sum and the running carry, the creating performed by a hardware partial product generator;

combining the six partial products into two partial products, the combining performed by a 6:2 hardware counter tree, the 6:2 hardware counter tree connected to the hardware partial product generator; and storing the two partial products in the hardware running sum latch and the hardware running carry latch, the hardware input latch, the hardware running sum latch and the hardware running carry latch connected to the hardware partial product generator;

combining the running sum and the running carry in a hardware adder to generate a final binary result, the final binary result having a value equivalent to the BCD number, wherein the BCD number converted is for a financial calculation; and storing the final binary result in a hardware result latch.

2. The method of claim 1 wherein the 6:2 hardware counter tree includes four 3:2 hardware counters.

3. A system for converting from decimal to binary using a hardware counter tree, the system comprising:

a binary coded decimal (BCD) conversion mechanism including a hardware input latch, a hardware running sum latch, a hardware running carry latch, a hardware partial product generator, a 6:2 hardware counter tree connected to the hardware partial product generator for combining six partial products into two partial products, and the hardware partial product generator is connected to the hardware input latch, the hardware running sum latch, and the hardware running carry latch, wherein the hardware input latch is for receiving a BCD number made up of one or more sets of three digits, the hardware running sum latch is for storing a running sum and is initialized to zero for each BCD number received by the hardware input latch, and further wherein the hardware running carry latch is for storing a running carry and is initialized to zero for each BCD number received by the hardware input latch, and further wherein the hardware partial product generator is for creating six partial products based on a set of three digits, the running sum and the running carry, the BCD conversion mechanism for performing a method comprising:

repeating for each set of three digits in the BCD number in order from the set of three digits containing the three most significant digits of the BCD number to the set of three digits containing the three least significant digits of the BCD number:

creating six partial products based on the set of three digits, the running sum and the running carry using the hardware partial product generator;

combining the six partial products into two partial products using the 6:2 hardware counter tree; and storing the two partial products in the hardware running sum latch and the hardware running carry latch;

a hardware adder for combining the running sum and the running carry to generate a final binary result, the final binary result having a value equivalent to the BCD number, wherein the BCD number converted is for a financial calculation; and a hardware result latch for storing the final binary result.

4. The system of claim 3 wherein the 6:2 hardware counter tree includes four 3:2 hardware counters.

5. The system of claim 4 wherein first and second 3:2 hardware counters are connected to a third 3:2 hardware counter and the first and third 3:2 hardware counters are connected to a fourth 3:2 hardware counter, the first 3:2 hardware counter for outputting a first sum and first carry to the third 3:2 hardware counter, and the second 3:2 hardware counter for outputting a second sum to the third 3:2 hardware counter and a second carry to the fourth 3:2 hardware counter.

6. A computer program product for converting from decimal to binary using a counter tree, the computer program product comprising:

a tangible storage medium readable by a processing circuit and storing instructions for execution by the processing circuit for performing a method comprising:

receiving a binary coded decimal (BCD) number made up of one or more sets of three digits into an input latch;

setting a running sum in a running sum latch and a running carry in a running carry latch to zero;

repeating for each set of three digits in the BCD number in order from the set of three digits containing the three most significant digits of the BCD number to the set of three digits containing the three least significant digits of the BCD number:

creating six partial products based on the set of three digits, the running sum and the running carry, the creating performed by a partial product generator;

combining the six partial products into two partial products, the combining performed by a 6:2 counter tree, the 6:2 counter tree communicating with the partial product generator; and storing the two partial products in the running sum latch and the running carry latch, wherein the input latch, the running sum latch and the running carry latch are in communication with the partial product generator;

combining the running sum and the running carry in an adder to generate a final binary result, the final binary result having a value equivalent to the BCD number, wherein the BCD number converted is for a financial calculation; and storing the final binary result in a result latch.

7. The computer program product of claim 6 wherein the 6:2 counter tree includes four 3:2 counters.

* * * * *

UNITED STATES PATENT AND TRADEMARK OFFICE
CERTIFICATE OF CORRECTION

PATENT NO. : 7,660,838 B2  Page 1 of 1
APPLICATION NO. : 11/054233
DATED : February 9, 2010
INVENTOR(S) : Carlough et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 891 days.

Signed and Sealed this

Thirtieth Day of November, 2010

David J. Kappos
*Director of the United States Patent and Trademark Office*